(12) United States Patent
Seibert

(10) Patent No.: US 7,940,820 B2
(45) Date of Patent: May 10, 2011

(54) METHOD OF PROTECTING A LASER AGAINST DAMAGE CAUSED BY UNDESIRED INCIDENT LIGHT IN A RESONATOR

(75) Inventor: Claus Seibert, Heidelberg (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 417 days.

(21) Appl. No.: 12/123,600

(22) Filed: May 20, 2008

(65) Prior Publication Data

US 2009/0103578 A1 Apr. 23, 2009

(30) Foreign Application Priority Data

May 25, 2007 (DE) .......................... 10 2007 024 483

(51) Int. Cl.
*H01S 3/13* (2006.01)
(52) U.S. Cl. ............ 372/29.01; 372/29.011; 372/29.015; 372/38.01; 372/38.02
(58) Field of Classification Search ............... 372/29.01, 372/29.011, 29.015, 38.01
See application file for complete search history.

(56) References Cited

U.S. PATENT DOCUMENTS

| 5,659,414 | A | * | 8/1997 | Appel et al. | ............... | 359/196.1 |
|---|---|---|---|---|---|---|
| 5,799,029 | A | | 8/1998 | Rossi et al. | | |
| 5,930,280 | A | | 7/1999 | Rossi et al. | | |
| 6,305,851 | B1 | | 10/2001 | Stummer | | |
| 6,603,498 | B1 | | 8/2003 | Konnunaho et al. | | |
| 6,818,856 | B2 | | 11/2004 | Yamazaki et al. | | |
| 2005/0084202 | A1 | * | 4/2005 | Smith et al. | ..................... | 385/14 |
| 2009/0301208 | A1 | * | 12/2009 | Kinugasa | ........................ | 73/705 |

FOREIGN PATENT DOCUMENTS

| DE | 102004056621 A1 | 2/2006 |
|---|---|---|
| EP | 1375052 A1 | 1/2004 |
| JP | 9181384 A | 7/1997 |

OTHER PUBLICATIONS

German Patent and Trademark Office Search Report, dated Jul. 26, 2007.
European Search Report dated Aug. 20, 2008.

* cited by examiner

*Primary Examiner* — Dung T Nguyen
(74) *Attorney, Agent, or Firm* — Laurence A. Greenberg; Werner H. Stemer; Ralph E. Locher

(57) ABSTRACT

A method of protecting a laser against damage caused by undesired incident light in a resonator includes measuring a parameter, which is a measure for the optical power of the incident light. In more concrete terms, the optical power occurring at a resonator mirror is measured. In response to a result of the measurement, a pumping power for the laser is reduced to reduce the optical power in the resonator to a value that is uncritical for the laser.

11 Claims, 4 Drawing Sheets

METHOD OF PROTECTING A LASER AGAINST DAMAGE CAUSED BY UNDESIRED INCIDENT LIGHT IN A RESONATOR

CROSS-REFERENCE TO RELATED APPLICATION

This application claims the priority, under 35 U.S.C. §119, of German Patent Application DE 10 2007 024 483.7, filed May 25, 2007; the prior application is herewith incorporated by reference in its entirety.

BACKGROUND OF THE INVENTION

Field of the Invention

The invention relates to a method of protecting a laser against damage caused by undesired incident light in a resonator, by measuring a parameter which is a measure for the optical power of the incident light and reducing a pumping power for the laser in response to a result of the measurement, so that the optical power in the resonator is reduced to a value that is uncritical for the laser.

It is known to use diode lasers which, in particular, can be individually activated and are disposed on a diode laser bar, to create or image printing plates, i.e. to process blank printing plates to obtain a structured printing plate, in particular for lithographic offset printing. Although potential reflection surfaces in a plate exposure unit or platesetter are prophylactically blackened or coated with an absorbent material, in practice undesired light reflections may occur, for example when a plate is being imaged near its edges. That may, for instance, be the case when aluminum abrasion waste from the printing plate accumulates during the operation of the apparatus, thus increasing reflectivity and incurring the risk that laser light may be reflected back into the laser or lasers that image the plate.

It has become known to use Faraday isolators between a laser and a potential reflecting surface in order to protect the laser against back reflection and other parasitic incident light. The Faraday isolators only transmit the laser radiation in a direction away from the laser and weaken light in the opposite direction. However, in the context of imaging printing plates, where a large number of illumination channels are used in parallel, that configuration has two important disadvantages: it requires a large amount of space and it is very expensive. Thus, such a configuration is impractical for economic reasons.

As an alternative to a passive protection against undesired incident light, U.S. Pat. No. 6,305,851, for example, describes an active system to avoid damage to a laser by back reflections in the context of an optical communication device. The light which is reflected back is measured. A measuring photodiode may be introduced into the path of the light through the use of an optical coupler. The laser is shut down when an imperfect connection to an optical connector exists in such a way that too much light is reflected back. A disadvantage of that technical teaching in the context of imaging printing plates is that the introduction of additional optical coupling elements (beam dividers) and measurement photodiodes requires a large amount of space.

BRIEF SUMMARY OF THE INVENTION

It is accordingly an object of the invention to provide a method of protecting a laser against damage caused by undesired incident light in a resonator, which overcomes the hereinafore-mentioned disadvantages of the heretofore-known methods of this general type and which quickly detects undesired incident light in a laser, in particular in a laser for a printing plate exposure unit or imaging device for a printing plate, to protect the laser against damage.

With the foregoing and other objects in view there is provided, in accordance with the invention, a method of protecting a laser against damage caused by undesired incident light in a resonator. The method comprises measuring a parameter as a measure for an optical power of incident light occurring at a resonator mirror, and
reducing a pumping power for the laser in response to a result of the measuring step to reduce the optical power in the resonator to a value uncritical for the laser.

Thus, the method of protecting a laser, in particular in an imaging device for a printing plate or a platesetter, against damage caused by undesired incident light in a resonator, in particular light emitted from the laser and reflected back or laser light reflected back, in accordance with the invention, includes measuring a parameter which is a measure for the optical power of the incident light. In more concrete terms, the optical power occurring on a resonator mirror is measured. In response to the result of the measurement, a pumping power for the laser is reduced to reduce the optical power in the resonator to a value which his uncritical for the laser, in particular to a value below a value of a usual or regular operating power, or to shut down the laser. To put it differently, it is not the light which is reflected back that is measured, but rather it is the optical power in the resonator that is detected or determined in quantitative terms on a resonator mirror. In other words, a part of the optical power in the resonator is measured. The measured optical power is, in particular, the current optical power, i.e. the optical power prior to a measure for avoiding damage to the laser. The measurement may be referred to as an intracavity measurement. The parameter may be a direct or indirect measure for the optical power of the incident light. To put it differently, the parameter may allow a direct measurement of the optical power of the incident light or may be used to indirectly calculate the optical power of the incident light.

In accordance with the invention, a parameter is measured which is directly relevant for a potential damage to the laser. Such a measurement and its evaluation may be carried out quickly. Since the incident light is only an indirect cause for the risk of damage, the method of the invention advantageously directly measures and processes the physical parameter which is actually relevant and has a direct influence, i.e. the optical power in the resonator of the laser. The response to a risk of damage may thus be quick. In this context, a space-saving structure can be implemented for the application of the method of the invention.

In accordance with another mode of the invention, the resonator mirror may, in particular, be different from the output coupling resonator mirror (output facet of the laser), in particular the rear facet of the resonator (with two resonator mirrors). The resonator mirror which is used for the measurement may also be an output coupling resonator mirror. Moreover, the occurring optical power may be measured through the use of a light-sensitive detector, in particular a photodiode, which is positioned behind the resonator mirror, in particular outside the resonator.

In accordance with a further mode of the invention, the laser is preferably a single-mode laser or single-mode emitter. In other words, only one mode of the laser is operated. This manner of operating the laser is especially advantageous for imaging printing plates due to its radiation properties. At the same time, lasers of this type are particularly sensitive to undesired incident light, making a protection against damage in accordance with the invention particularly useful.

In accordance with an added, particularly advantageous mode of the method of the invention for protecting a laser against damage, the pumping power of the laser is controlled simultaneously by a pumping parameter control and a light power control. In this context, the optical power of the laser at the (upper) light power limit of the light power control may be higher than the optical power of the laser at the (upper) pumping parameter limit of the pumping parameter control. A particular advantage in this context is that one control may be used for operating the laser, whereas the other control is provided to protect the laser.

In accordance with an additional mode of the invention, the method is preferably used for lasers having a pumping power source which can be directly modulated. The laser may be a single diode laser, a diode laser on a diode laser bar, a VCSEL (Vertical Cavity Surface Emitting Laser) with an internal resonator, a VCSEL with external resonator, a fiber laser, or a solid-state laser. Fiber lasers or solid-state lasers may, in particular, be diode-pumped.

In accordance with yet another, especially preferred mode of the invention, in particular in the context of the imaging of printing plates, the laser used in the method of the invention is an individually controllable diode laser on a diode laser bar.

In accordance with yet a further mode of the invention, the resonator mirror in the method of the invention may be a resonator mirror of the laser (which is preferred) or a resonator mirror of a different laser. In particular, for the embodiment of implementing the method on diode lasers on a diode laser bar, the measurement on one diode laser may alternatively or additionally be used as the basis for a reduction of the optical power in other diode lasers which are potentially faced with the same risk of damage because the diode lasers on the bar are very close. The reduction of the optical power in another laser may be carried out at a later instant than the measurement. In one concrete embodiment in the context of the imaging of printing plates, a diode laser located at the edge of the diode laser bar may be used as a sensor channel. This diode laser is powered with a low current. The position of the printing plate edge on a receiving cylinder is determined based on its photodiode signal. The determined position is then used to calculate the instant at which the other diode lasers can be switched on securely.

In accordance with yet an added mode of the invention for protecting a laser against damage, in order to determine whether or not a response is necessary, the value of the measured parameter or a value derived from this value by processing of this value may be compared to a lower threshold and/or an upper threshold and the pumping power may be reduced if the value which is evaluated in the comparison is below the lower threshold and/or above the upper threshold.

In accordance with a concomitant mode of the invention, the method is preferably carried out during the imaging of a printing plate in a laser, which is part of a device for imaging printing plates. In particular, the imaging device may be suitable for imaging lithographic offset printing plates. The printing plates may be sheet-like printing plates. The imaging of a printing plate may also be referred to as the production of a printing plate. Specific features of such an imaging device are disclosed in German Published, Non-Prosecuted Patent Application DE 10 2005 042 680 A1 and International Publication No. WO 2002/45007 A1, corresponding to U.S. Pat. No. 6,603,498. The content of both documents is explicitly incorporated by reference herein. The method of the invention advantageously ensures that the imaging channels are shut down as soon as one or more laser image dots no longer hit an (absorbing) printing surface of the printing plate, but instead a reflecting surface such as the surface of the cylinder receiving the printing plate. Lasers which are suitable for imaging printing plates, in particular lithographic offset printing plates, may have output capacities of more than 100 mW, preferably more than 150 mW.

Other features which are considered as characteristic for the invention are set forth in the appended claims.

Although the invention is illustrated and described herein as embodied in a method of protecting a laser against damage caused by undesired incident light in a resonator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
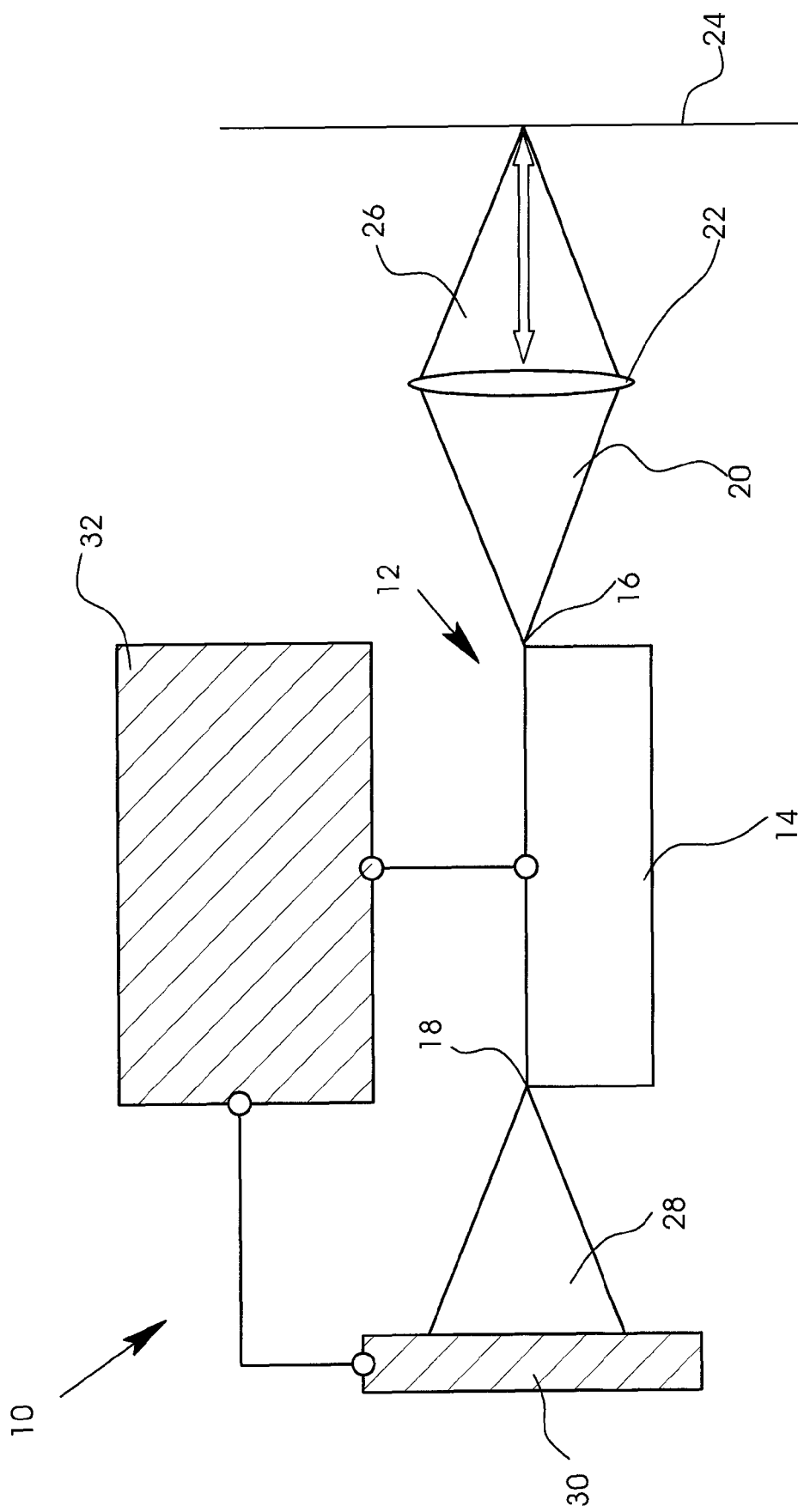
FIG. 1 is a diagrammatic view of an embodiment of an imaging device including a diode laser on a diode laser bar suitable for imaging printing plates and for implementing the method of the invention.

Referring now to the figures of the drawings in detail and first, particularly, to FIG. 1 thereof, there is seen a diagrammatic illustration of one embodiment of an imaging device 10 including a diode laser 14 on a diode laser bar 12 suitable for the imaging of printing plates and for the implementation of the method of the invention. The diode lasers 14 are individually controllable or actuatable. Each diode laser 14 is a light source of an imaging channel having an intensity which can be modulated. Image dots are located disjunctively or without overlap on the printing plate to be imaged. The diode laser 14 has a front facet 16 and a rear facet 18. Emitted light 20 exits from the front facet 16 and is directed to a printing plate through the use of an optical imaging system 22. FIG. 1 shows a reflective surface 24, which causes light 26 to be reflected back into a beam path from the surface 24 to the front facet 16 of the diode laser 14 and finally into the resonator of the diode laser 14. The light 26 which is reflected back into the laser by the reflective surface is amplified in the resonator. Light 28 exiting from the rear facet 18 of the diode laser 14 is measured in quantitative terms on a photodiode 30. The photodiode 30 is connected to a control unit 32 of the diode laser 14, which is preferably an ASIC (Application-Specific Integrated Circuit). The control unit 32 actuates the diode laser 14. To be more precise, the control unit 32 can vary the pumping current of the diode laser 14. In accordance with the invention, the occurrence of a high optical power in the resonator is measured through the use of the photodiode, because in this case the intensity of the exiting light 28 increases. The control unit 32 reduces the pumping current of the diode laser in response to the measurement of a high intensity to reduce the optical power in the resonator. In other words, when a maximum photo diode signal is exceeded, the control unit 32, in particular the ASIC, controls the diode laser current to a value which is no longer a danger to the diode laser. In a preferred embodiment, the structure shown in FIG. 1 is implemented in a compact or integrated way.

Figure 2:
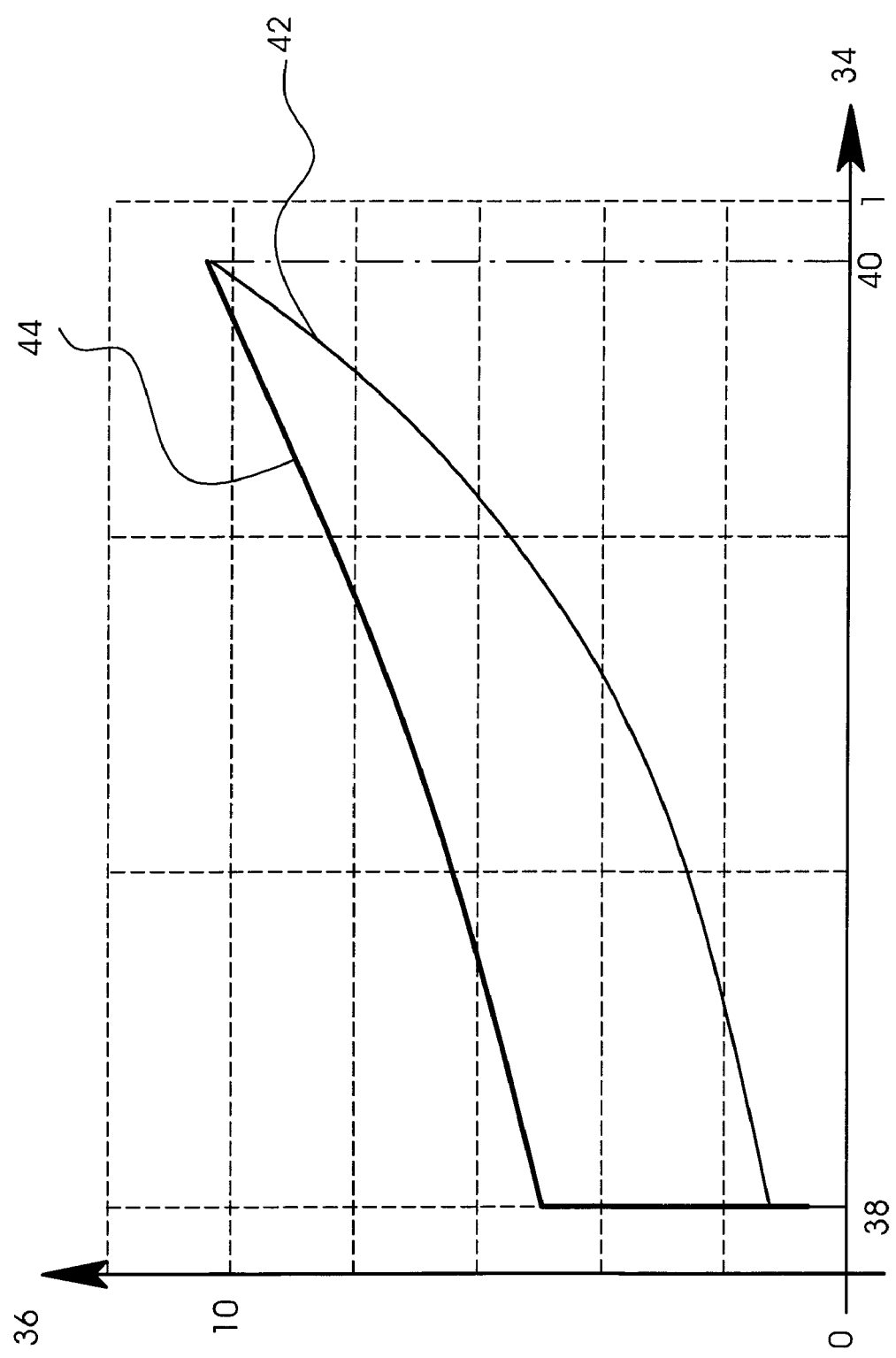
FIG. 2 is a graphic representation of optical power in a resonator with and without undesired incident light which has been reflected back.

FIG. 2 is a graphic representation of an optical power 36 in the resonator as a function of a position 34 in the resonator with and without undesired incident reflected light for a preferred embodiment of a diode laser 14 on a diode laser bar 12 in an imaging device 10 for printing plates. The invention makes use of the fact that the optical power exiting from the rear facet 18 of the diode laser 14 is highly sensitive to back reflection from the reflective surface 24.

Due to the resonator configuration of the diode laser 14, a specific ratio between the powers at the front facet 16 and at the rear facet 18 is established. In common situations when back reflections occur, the nominal value at the rear facet 18 may be increased by a factor of 3 to 4 (position 38 of the rear facet). In contrast, the nominal value at the front facet 16 may be substantially unchanged (position 40 of the front facet). FIG. 2 graphically illustrates a progression or course 42 of the optical power without back reflection and a progression or course 44 of the optical power with back reflection. Both progressions or courses rise monotonously from the position 38 of the rear facet to the position 40 of the front facet. With the aid of the photodiode 30, the closed-loop control unit 32 measures this deviation from the nominal value and shuts down the diode laser 14 when a predetermined limit is exceeded.

Figure 3:
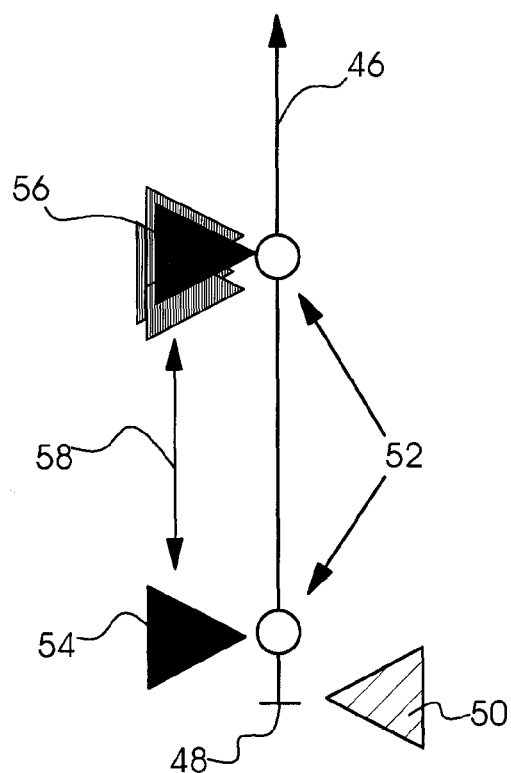
FIG. 3 is a diagram used to explain the effect of a single control loop for control of the diode laser.

FIG. 3 diagrammatically illustrates the effect of a single control loop for the control of the diode laser 14. Values for a pumping parameter control 48, which in the present case of the diode laser 14 of the imaging device 10 is a current control, and for a light power control 50, are plotted on a laser current/light power axis 46. Initially, two operating points 52 exist, which correspond to the situations "diode laser off" and "diode laser on." For the operation of the diode laser 14, the nominal value of the current control is switched back and forth between levels "laser current off" 54 and imaging current 56 (along a changeover 58). In this single configuration, which is also referred to as "open loop," the light power control is deactivated. The photo diode current can be used for reading out through an internal ADC.

Figure 4:
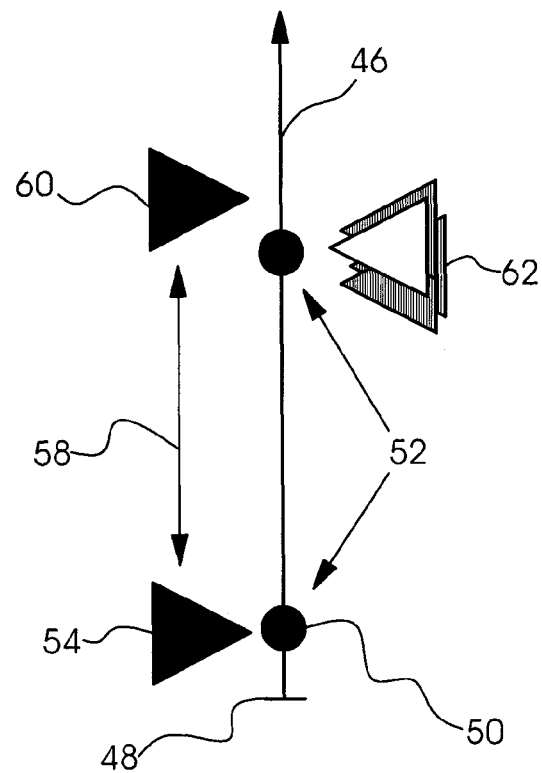
FIG. 4 is a diagram used to explain the effect of a double control loop for control of the diode laser.

FIG. 4 is a diagrammatic representation used to explain the effect of a double control loop for controlling the diode laser 14. This configuration may be referred to as a closed loop. In this figure, too, values for the pumping parameter control 48, in this case a current control, and for the light power control 50, are plotted on the laser current/light power axis 46 and the two operating points 52 are shown. Now a changeover 58 of the nominal values of the current control occurs between the level "laser current off" 54 and overcurrent 60, which is greater than the upper operating point 52. In contrast, the light power control 50 is set to the upper operating point 52, i.e. the imaging light power 62. In this situation, the controller which wants to drive the lower current for the diode laser 14 gains control over the pumping current.

Figure 5:
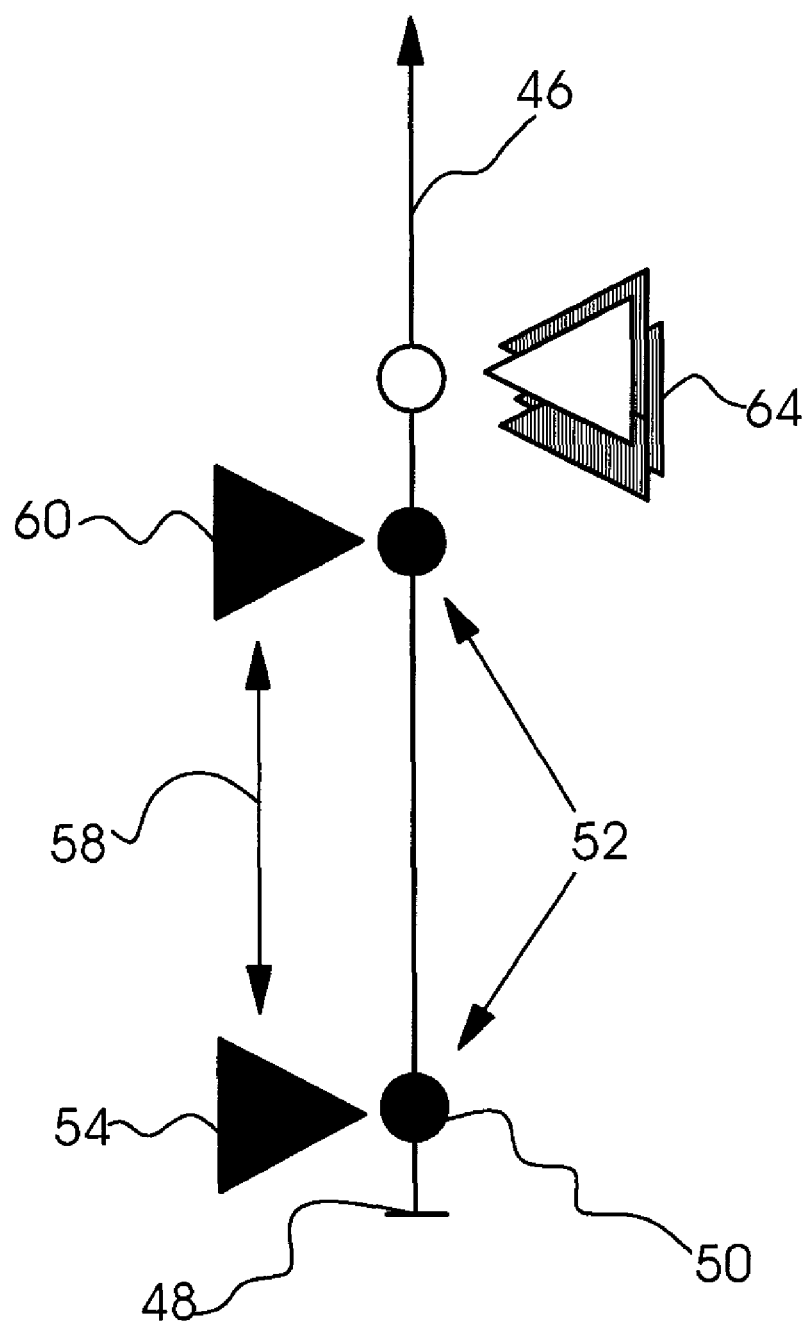
FIG. 5 is a diagram used to explain the effect of a double control loop for the control of the diode laser, in which a light power limit is higher than a current power limit (pumping power limit).

FIG. 5 illustrates a diagram for explaining the effect of the double control loop for controlling the diode laser, with the light power limit being higher than the current power limit (pumping power limit). This configuration may also be referred to as the protected mode used to prevent damage resulting from back reflections of the laser light. Again, the two operating points 52 are plotted on the laser current/light power axis 46 which has already been shown in FIGS. 3 and 4. A changeover 58 of the nominal value for the current control (pumping parameter control 48) occurs between the level "laser current off" 54 and the overcurrent 60, which in this case is on the upper operating point 52. The imaging light power 64 is set to be higher than the overcurrent 60. Consequently, a load-independent current is controlled. In the case of the occurrence of a back reflection, the light power control 50 controls the maximum light power by reducing the laser current.

The invention claimed is:

1. A method of protecting a laser against damage caused by undesired incident light in a resonator, the method comprising the following steps:
   measuring a parameter as a measure for an optical power of incident light occurring at a resonator mirror;
   reducing a pumping power for the laser in response to a result of the measuring step to reduce the optical power in the resonator to a value uncritical for the laser; and
   simultaneously controlling a pumping power of the laser by a pumping parameter control and a light power control, the optical power of the laser at a light power limit of the light power control being greater than the optical power of the laser at a pumping parameter limit of the pumping parameter control.

2. The method according to claim 1, which further comprises providing the resonator mirror as at least one of a mirror different from an output coupling resonator mirror or a rear facet of the resonator.

3. The method according to claim 1, which further comprises measuring the occurring optical power with a light-sensitive detector positioned behind the resonator mirror.

4. The method according to claim 3, wherein the light-sensitive detector is a photodiode.

5. The method according to claim 1, which further comprises operating the laser as a single-mode laser.

6. The method according to claim 1, which further comprises directly modulating a pumping power source.

7. The method according to claim 1, wherein the laser is selected from the group consisting of a single diode laser, a diode laser on a diode laser bar, a VCSEL, a fiber laser, and a solid-state laser.

8. The method according to claim 1, wherein the laser is a separately controllable diode laser on a diode laser bar.

9. The method according to claim 1, wherein the resonator mirror is a resonator mirror of the laser or a resonator mirror of another laser.

10. A method of protecting a laser against damage caused by undesired incident light in a resonator, the method comprising the following steps:
    measuring a parameter as a measure for an optical power of incident light occurring at a resonator mirror;
    reducing a pumping power for the laser in response to a result of the measuring step to reduce the optical power in the resonator to a value uncritical for the laser;
    determining if a response is necessary by comparing the value of the measured parameter or a value derived from the value of the measured parameter by processing, to at least one of a lower threshold or an upper threshold; and
    reducing the pumping power when a value evaluated in the comparison is at least one of below the lower threshold or above the upper threshold.

11. The method according to claim 1, which further comprises carrying out the method for a laser of an imaging device for printing plates during imaging of a printing plate.

* * * * *